United States Patent
Ghandi et al.

(10) Patent No.: US 10,636,660 B2
(45) Date of Patent: Apr. 28, 2020

(54) SUPER-JUNCTION SEMICONDUCTOR DEVICE FABRICATION

(71) Applicant: General Electric Company, Schenectady, NY (US)

(72) Inventors: Reza Ghandi, Niskayuna, NY (US); Alexander Viktorovich Bolotnikov, Niskayuna, NY (US); Peter Almern Losee, Clifton Park, NY (US); David Alan Lilienfeld, Niskayuna, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 16/228,356

(22) Filed: Dec. 20, 2018

(65) Prior Publication Data
US 2020/0105529 A1  Apr. 2, 2020

Related U.S. Application Data

(60) Provisional application No. 62/738,961, filed on Sep. 28, 2018.

(51) Int. Cl.
*H01L 21/04* (2006.01)
*H01L 29/06* (2006.01)

(52) U.S. Cl.
CPC ...... *H01L 21/0465* (2013.01); *H01L 29/0634* (2013.01)

(58) Field of Classification Search
CPC .................................................. H01L 21/0465
See application file for complete search history.

(56) References Cited

U.S. PATENT DOCUMENTS

| 6,107,142 A | 8/2000 | Suvorov et al. |
| 7,381,992 B2 | 6/2008 | Ryu |
| 7,737,469 B2 * | 6/2010 | Saito ............ H01L 29/872 257/197 |

(Continued)

FOREIGN PATENT DOCUMENTS

CN   102194701 B   3/2014

OTHER PUBLICATIONS

Shenoy, Praveen M., et al.; "Analysis of the effect of charge imbalance on the static and dynamic characteristics of the super junction MOSFET", 11th International Symposium on Power Semiconductor Devices and ICs. ISPSD'99 Proceedings (Cat. No. 99CH36312), pp. 99-102, Canada, May 26-28, 1999.

(Continued)

*Primary Examiner* — Raj R Gupta
(74) *Attorney, Agent, or Firm* — Fletcher Yoder, P.C.

(57) ABSTRACT

To manufacture a super-junction (SJ) layer of a SJ device, an epitaxial (epi) layer having a first conductivity type may be formed on an underlying layer, which may be formed from a wide-bandgap material. A first mask may then be formed onto a first portion of the epi layer, and a first set of SJ pillars may be selectively implanted into a second portion of the epi layer exposed by the first mask. Then, a second mask may be formed on the second portion of the epi layer that is self-aligned relative to the first mask. After removing the first mask, a second set of SJ pillars may be selectively implanted into the first portion of the epi layer. Removing the second mask may then yield the SJ layer.

24 Claims, 5 Drawing Sheets

(56) References Cited

U.S. PATENT DOCUMENTS

| | | |
|---|---|---|
| 8,841,698 B2 | 9/2014 | Neudeck |
| 9,647,059 B2 | 5/2017 | Guan et al. |
| 2003/0132450 A1 | 7/2003 | Minato et al. |
| 2005/0139914 A1* | 6/2005 | Blanchard ......... H01L 21/76208 |
| | | 257/341 |
| 2006/0276014 A1 | 12/2006 | Hsu et al. |
| 2016/0322490 A1 | 11/2016 | Hirler et al. |
| 2016/0380059 A1 | 12/2016 | Losee et al. |
| 2017/0092717 A1 | 3/2017 | Meiser et al. |
| 2017/0278924 A1 | 9/2017 | Bolotnikov et al. |
| 2018/0166531 A1* | 6/2018 | Bolotnikov ......... H01L 29/0634 |

OTHER PUBLICATIONS

Yu, Liangchun, et al.; "Modeling and Optimal Device Design for 4H—SiC Super-Junction Devices", IEEE Transactions on Electron Devices, vol. 55, Issue: 8, pp. 1961-1969, Aug. 2008.
Yuan, Shoucai, et al.; "A Study of Super Junction Trench Gate IGBT with Fully Self-Aligned Fabrication Technology", IETE Journal of Research, vol. 62, Issue: 4, pp. 446-452, 2016.
International Search Report and Written Opinion; PCT/US2019/052476 dated Jan. 10, 2020.

* cited by examiner

SUPER-JUNCTION SEMICONDUCTOR DEVICE FABRICATION

CROSS-REFERENCE TO RELATED APPLICATIONS

This application claims priority to U.S. Patent Provisional Application No. 62/738,961, entitled "SUPER-JUNCTION SEMICONDUCTOR DEVICE FABRICATION", filed Sep. 28, 2018, which is herein incorporated by reference in its entirety.

BACKGROUND

The subject matter disclosed herein relates to semiconductor devices and, more specifically, to super junction (SJ) semiconductor devices.

For semiconductor power devices, super-junction structures offer several advantages. For example, for the same conduction loss, super-junction devices demonstrate higher blocking voltage relative to traditional unipolar device designs. However, the performance, such as the maximum breakdown voltage and/or blocking voltage, of a super-junction device depends on charge balance (e.g., doping uniformity) between adjacent, oppositely doped regions of the device. Accordingly, to increase the maximum breakdown voltage and/or blocking voltage of such super-junction devices, it may be desirable to develop a process for super-junction devices fabrication with improved doping controllability.

BRIEF DESCRIPTION

In one embodiment, a method of manufacturing a super-junction (SJ) layer of a SJ device includes forming a first epitaxial (epi) layer having a first conductivity type on an underlying layer. The underlying layer is formed from a wide-bandgap material. Further, the method includes forming a first mask by disposing a first material on a first portion and a second portion of the first epi layer and then patterning the first material to selectively expose the second portion of the first epi layer. The method also involves selectively implanting a first set of SJ pillars having the first conductivity type into the exposed second portion of the first epi layer. The method further involves forming a second mask by disposing a second material on the second portion of the first epi layer. The second mask is self-aligned relative to the first mask and the second material is different from the first material. Additionally, the method involves removing the first mask to expose the first portion of the first epi layer without exposing the second portion of the first epi layer. Further, the method includes selectively implanting a second set of SJ pillars having a second conductivity type into the exposed first portion of the first epi layer and removing the second mask to yield the SJ layer.

In another embodiment, a super-junction (SJ) semiconductor device intermediate includes an epitaxial (epi) layer having a first conductivity type. The epi layer is made of a wide-bandgap material, and a first portion of the epi layer includes a plurality of implanted super-junction (SJ) pillars having a second conductivity type. The SJ semiconductor device intermediate further includes a first high energy implantation mask disposed directly above the first portion of the epi layer. The first high energy implantation mask is made of a first material. Further, the SJ semiconductor device intermediate includes a second high energy implantation mask disposed self-aligned relative to the first high energy implantation mask directly above a second portion of the epi layer. The second high energy implantation mask may be made of a second material different from the first material, and the second portion of the epi layer is not covered by the first high energy implantation mask.

In another embodiment, a method involves forming an epitaxial (epi) layer having a first conductivity type on an underlying layer. The underlying layer is formed from a wide-bandgap material. The method further involves forming a first mask made of a first material disposed on a first portion of the epi layer. A second portion of the epi layer is exposed by the first mask. Further, the method involves selectively implanting a first set of super-junction (SJ) pillars having a second conductivity type into the exposed second portion of the epi layer. Additionally, the method includes forming a second mask 1 disposed on the second portion of the epi layer. The second mask is self-aligned relative to the first mask and the second material may be different from the first material. The method also includes removing the first mask to expose the first portion of the epi layer without exposing the second portion of the epi layer. Further, the method involves selectively implanting a second set of SJ pillars having the first conductivity type into the exposed first portion of the epi layer. The method also involves removing the second mask to yield a super-junction (SJ) layer and forming a device layer having the first conductivity type above the SJ layer to yield a super-junction (SJ) semiconductor device.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
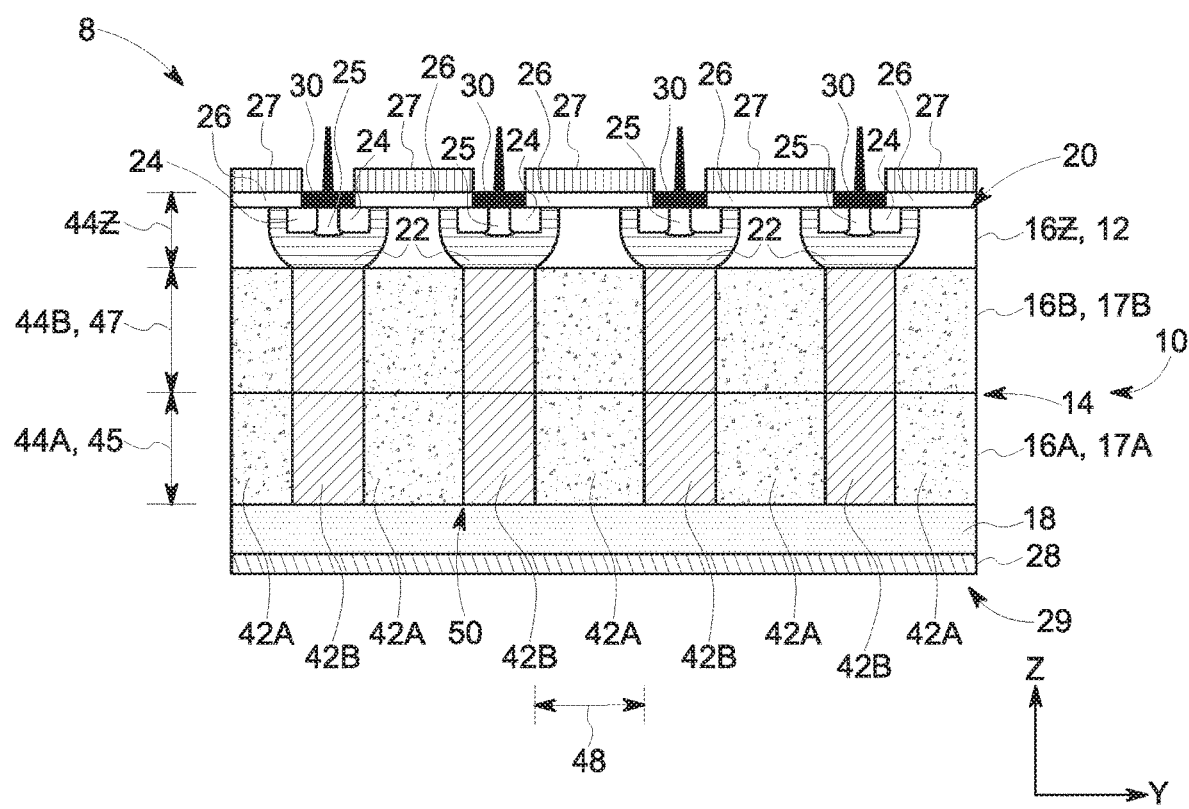
FIG. 1 is a cross-sectional view of a super-junction (SJ) region of a SJ semiconductor device, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. If ranges are disclosed, the endpoints of all ranges directed to the same component or property are inclusive and independently combinable. The modifier "approximately" used in connection with a quantity is inclusive of the stated value and has the meaning dictated by the context (e.g., includes the degree of process variations or errors associated with measurement of the particular quantity). The modifier "substantially," when used in combination with a descriptive term, is intended to convey that the descriptive terms mostly, mainly, or predominately applies (e.g., applies to greater than 90%, greater than 95%, or greater than 99% of the time), and may be used to account for limited exceptions that may result from process variations and technical limitations understood by those of the art.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. Further, as used herein, the term "disposed on" refers to layers disposed directly in contact with each other or indirectly by having intervening layers there between, unless otherwise specifically indicated. Accordingly, the term "disposed directly on" as used herein means that the two layers are directly in contact with each other with no intervening layers there between. The term "adjacent" as used herein means that the two layers are disposed contiguously and are in direct contact with each other.

In the present disclosure, when a layer/region is being described as "on" another layer or substrate, it is to be understood that the layers/regions can either be directly contacting each other or have one (or more) layer or feature between the layers and regions. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "directly above" and "directly below" describe the relative position of layers/regions directly in contact with each other with no intervening layers there between. Further, as used herein, the terms "lower," "middle," or "bottom" refer to a feature (e.g., epitaxial layer) that is relatively nearer the substrate layer, while the terms "top" or "upper" refer to the particular feature (e.g., epitaxial layer) that is relatively distant from the substrate layer.

Present embodiments are directed toward designs and methods of manufacturing vertical semiconductor super-junction (SJ) devices. The disclosed designs and methods are useful in the manufacture of SJ devices, such as metal-oxide-semiconductor field-effect transistors (MOSFETs), junction field effect transistors (JFETs), bipolar junction transistors (BJTs), diodes, as well as other SJ devices that may be useful for medium-voltage (e.g., 2 kilovolts (kV)-10 kV) and high-voltage (e.g., greater than or equal to 10 kV or 10 kV-20 kV) power conversion applications. Further, the disclosed designs and methods are useful in the manufacture of SJ devices from different semiconductors, such as silicon (Si) devices, wide-bandgap devices (e.g., silicon carbide (SiC) devices, gallium nitride devices, diamond devices, aluminum nitride devices, boron nitride devices, and/or the like), as well as SJ devices manufactured using other semiconductor materials, or a combination thereof.

As discussed below, the disclosed SJ devices include multi-layered drift regions (e.g., implemented using repeated epitaxial growth and dopant implantation steps). As used herein, the term "multi-layered," as well as references to a particular number of layers (e.g., "two-layered," "three-layered," "four-layered,"), refers to the number of epitaxial (epi) layers of the SJ device. For the disclosed device designs, one or more of the epi layers are super-junction (SJ) layers. Each SJ layer includes a first set of super-junction (SJ) pillars and a second set of SJ pillars, which are each discrete, implanted regions that reshape the electrical field in the active area of a SJ device. Moreover, the first set of SJ pillars have doping of the opposite conductivity type relative to the second set of SJ pillars. For the disclosed SJ device embodiments, as discussed below, these SJ designs enable low conduction losses and high blocking voltages while still maintaining a relatively simple fabrication process.

It is presently recognized that, to provide high blocking voltages, each SJ layer should be fabricated to provide charge-balance effect in the active area of a SJ device. More specifically, the SJ layer may be implanted with a first set of uniformly doped SJ pillars of the first type of conductivity type (e.g., n-type) disposed adjacent to, and interleaved between, a second set of uniformly doped SJ pillars of the second conductivity type (e.g., p-type). However, misalignment (e.g., overlap and/or gaps) between the first and second sets of SJ pillars disturbs the uniformity of the first and second sets of SJ pillars, which can disrupt the uniformity of the electrical field and reduce the maximum blocking voltage of a SJ device. Accordingly, to reduce misalignment between adjacent, oppositely-doped pillars in the SJ layer during fabrication the disclosed SJ devices, a set of masks and a method of self-alignment is presently disclosed. More specifically, a first mask covers and shields a first portion of an epi layer of the SJ device, such that the first set of SJ pillars can be selectively implanted into a second portion of the epi layer exposed by a first mask. A second mask that is self-aligned relative to the first mask is then formed over the implanted first set of SJ pillars, wherein the second mask covers and shields the second portion of the epi layer. As used herein, the term "self-aligned" refers to a technique in which the first mask acts to guide the placement and/or formation of the second mask to provide precise alignment between features of the SJ device. Accordingly, rather than being lithographically patterned, the position of the second mask may completely defined by the first mask. After selectively removing the first mask, the second set of SJ pillars are selectively implanted into the first portion of the epi layer exposed by the second mask. The second mask is subsequently removed, yielding a SJ layer having approximately uniform alignment and balanced doping between the first and second sets of SJ pillars.

FIG. 1 is a perspective view of an embodiment of a super-junction (SJ) semiconductor device 8 having a drift region 10 that includes a device layer 12 disposed on a SJ region 14. It may be appreciated that, in order to more clearly illustrate certain components of the SJ semiconductor device 8, as well as other devices discussed below, certain commonly understood design elements (e.g., top metallization, passivation, edge termination, and so forth) may be omitted.

As discussed below, the drift region 10 of the SJ semiconductor device 8 illustrated in FIG. 1 includes a number of epitaxial layers 16 having a first conductivity type (e.g., n-type epi layers 16) that form the device layer 12 and the SJ region 14 of the SJ semiconductor device 8. Additionally, the epi layers 16 each have a dopant concentration, which may be the same or different, in certain embodiments. For instance, one or both of the epi layers 16 may have a dopant concentration approximately less than $5\times10^{15}$ per centimeter cubed ($cm^{-3}$) and/or approximately greater than or equal to $1\times10^{14}$ $cm^{-3}$. Further, while the illustrated embodiment includes two epi layers 16 (e.g., 16A and 16Z), the SJ semiconductor device 8 may include any suitable number of epi layers 16 (e.g., 3, 4, 5, 6, or more), including one or more SJ layers 17, to yield a SJ semiconductor device 8 having a particular desired voltage rating. In some embodiments, the epi layers 16 may be formed from one or more semiconductor materials, such as silicon and/or wide-bandgap materials (e.g., silicon carbide, gallium nitride, diamond, aluminum nitride, and/or boron nitride). The epi layers 16 may be fabricated using repeated cycles of epitaxial overgrowth. As illustrated, the first epi layer 16A is disposed above and adjacent to a substrate layer 18 having the first conductivity type, and the device epi layer 16Z is disposed above and adjacent to the first epi layer 16A. In other embodiments, the SJ semiconductor device 8 may include additional epi layers 16 (e.g., 16B, 16C, 16D, and so forth) intervening between the first epi layer 16A and the device epi layer 16Z, wherein each of the lower or buried epi layers are also SJ layers 17.

A top surface 20 of the device layer 12 of the illustrated SJ semiconductor device 8 includes well regions 22 having a second conductivity type (e.g., p-type well regions 22) and disposed adjacent to a source region 24 having the first conductivity type (e.g., n-type source region 24). In some embodiments, the well regions 22 may include a highly-doped region 25, which may have the same conductivity type as the well regions 22 (e.g., the second conductivity type) and a higher doping concentration compared to the well regions 22. A dielectric layer 26 (also referred to as a gate insulating layer or gate dielectric layer) is disposed adjacent to the device layer 12, and a gate electrode 27 is disposed adjacent to the dielectric layer 26. Further, the SJ region 14 is disposed on a substrate layer 18 (e.g., a semiconductor substrate layer, a wide-bandgap substrate layer), and a drain contact 28 is disposed on the bottom 29 of the SJ semiconductor device 8, adjacent to the substrate layer 18. Additionally, a source contact 30 is disposed adjacent to the top surface 20 of the device layer 12, and is disposed on a portion of both the source region 24 and the highly-doped region 25 of the device layer 12. During on-state operation, an appropriate gate voltage (e.g., at or above a threshold voltage ($V_{TH}$) of the SJ MOSFET device 8) may cause an inversion layer to be formed in a channel region (not shown), as well as a conductive path to be enhanced in a junction field-effect transistor (JFET) region (not shown) due to accumulation of carriers, allowing current to flow from the drain contact 28 (e.g., drain electrode, drain terminal) to the source contact 30 (e.g., source electrode, source terminal). The channel region may be generally defined as an upper portion of the well region 22 disposed below the gate electrode 27 and the dielectric layer 26.

To reduce on-state resistance (Rds(on)) and resultant on-state conduction losses, the SJ semiconductor device 8 includes a SJ region 14, which may include any suitable number of SJ layers 17. Each of the SJ layers 17 include a first set of SJ pillars 42A oppositely doped relative to a second set of SJ pillars 42B. In other words, the first set of SJ pillars 42A have a first conductivity type (e.g., n-type SJ pillars 42), while the second set of SJ pillars 42B have a second conductivity type (e.g., p-type SJ pillars 42). In some embodiments, the first set of SJ pillars 42A may be doped with nitrogen, phosphorous, or another suitable n-type dopants, while the second set of SJ pillars 42B are doped with boron, aluminum, or another suitable p-type dopant, or vice versa.

Further, the dopant concentration in the first set of SJ pillars 42A and in the second set of SJ pillars 42B of the SJ region 14B is approximately the same (e.g., ±3%, ±2%, ±1%). For example, in some embodiments, each of the first set of SJ pillars 42A and each of the second set of SJ pillars 42B may have a dopant concentration greater than $5\times10^{15}$ $cm^{-3}$ and/or less than $1\times10^{17}$ $cm^{-3}$. In some embodiments, the first set of SJ pillars 42A and the second set of SJ pillars 42B are each generally designed to substantially deplete and to generally provide similar amounts (e.g., substantially equal amounts) of effective charge (e.g., per $cm^2$, normalized to device active area) from ionized dopants under reverse bias. Accordingly, the illustrated super-junction structure allows the SJ semiconductor device 8 to achieve high blocking voltage and/or breakdown voltage, since the p-type semiconductor portions and the n-type semiconductor portions are both completely depleted under nominal blocking conditions. It may be appreciated that, in other embodiments, the device layer 12 may include other implanted features (e.g., features particular to other device structures/types) without spoiling the effect of the present approach.

The first epi layer 16A, the second epi layer 16B, and the device epi layer 16Z have respective thicknesses 44A, 44B, and 44Z, which may be the same or different, in certain embodiments. Additionally, the SJ pillars 42 in the SJ region 14 of the illustrated SJ semiconductor device 8 have a particular thickness (e.g., extending along the Z-axis). It should be appreciated that, in some embodiments, the thickness of the SJ pillars 42 may be the same between the first set of SJ pillars 42A and the second set of SJ pillars 42B. In some embodiments, for example, each of the SJ pillars 42 may extend through the entire thickness 44A of the epi layer 16A and may contact (e.g., electrically couple to) the substrate layer 18. Alternatively, each of the SJ pillars 42 may not extend through the entire thickness 44A of the first epi layer 16A, leaving a gap (e.g., a region of epi doping) between the SJ pillars 42 and the substrate layer 18. Moreover, in some embodiments, each of the first second set of SJ pillars 42B may contact (e.g., electrically couple to) a well region 22 having a like conductivity type (e.g., a p-type well region). Further, the thicknesses of the SJ pillars 42 may be different in different SJ layers 17 of the SJ region 14. For example, as illustrated, each of the first set of SJ pillars 42A and the second set of SJ pillars 42B in the first SJ layer 17A has a thickness 45, while each of the first set of SJ pillars 42A and the second set of SJ pillars 42B in the second SJ layer 17B has a thickness 47. The first set of SJ pillars 42A and the second set of SJ pillars 42B in the second SJ layer 17B extend through the entire thickness 44B of the epi layer 16B. By extending through the thickness 44B of the epi layer 16B, continuous, vertical SJ pillars 42 may be formed from each of the SJ layers 17 in the SJ region 14. The continuous, vertical SJ pillars 42 may then provide low conduction losses and high blocking voltages. Further, it should be appreciated that a total thickness of the first set of SJ pillars 42A is equivalent to the sum of the thickness 45 of the first set of SJ pillars 42A in the first SJ layer 17A and the thickness 47 of the first set of SJ pillars 42A in the second SJ layer 17B. Moreover, a total thickness of the second set of SJ pillars 42B is equivalent to the sum of the thickness 46 of the second set of SJ pillars 42B in the first SJ layer 17A and the thickness 46 of the second set of SJ pillars 42B in the second SJ layer 17B.

With respect to dimensions, each of the SJ pillars 42 may have a particular width 48 and a particular spacing 50. In certain embodiments, the dimensions (e.g., width 48, and/or spacing 50) of the SJ pillars 42 may vary along the Y-axis. Moreover, the dimensions of the first set of SJ pillars 42A may vary with respect to the dimensions of the second set of SJ pillars 42B. Further, the SJ pillars 42 may have different cross-sectional shapes (e.g., defined by the set of masks used during implantation). However, the dimensions of the first set of SJ pillars 42A in the first SJ layer 17A generally match the dimensions of a corresponding first set of SJ pillars 42A in the other SJ layers 17 (e.g., SJ layer 17B). Similarly, the dimensions of the second set of SJ pillars 42B in the first SJ layer 17A may match the dimensions of a corresponding second set of SJ pillars 42B in the other SJ layers 17 (e.g., SJ layer 17B), such that the corresponding first sets of SJ pillars 42A and the corresponding second sets of SJ pillars 42B of each of the SJ layers 17 are in alignment with each other.

Further, it should be appreciated that the doping of the epi layers 16, the doping of the SJ pillars 42, the thicknesses 44 of the epi layers 16, the thickness of the SJ pillars 42, the width 48 of the SJ pillars 42, and the spacing 50 between the SJ pillars 42 may be varied for different embodiments to enable desired electrical performance (e.g., desired blocking voltage) of the SJ semiconductor device 8. For example, in some embodiments, certain device parameters (e.g., the thickness 44 and doping of the epi layers 16) may be selected to provide a blocking voltage of the SJ semiconductor device 8 that is between approximately 1 kilovolt (kV) and 10 kV, 1 kV and 5 kV, or any other suitable range. Further, in some embodiments, the dopant concentration of the SJ pillars 42 may be between approximately $5 \times 10^{15}$ cm$^{-3}$ and approximately $1 \times 10^{17}$ cm$^{-3}$. In some embodiments, the dopant concentration of the epi layers 16 may be between approximately $4 \times 10^{14}$ cm$^{-3}$ and approximately $5 \times 10^{15}$ cm$^{-3}$.

Fabricating continuous, vertical super-junction pillars that extend through the thickness 44 of one or more epi layers 16 may be challenging for certain semiconductor materials having low diffusion coefficients of dopants. For example, fabricating such SJ pillars may be challenging for embodiments in which the epi layers 16 are fabricated from SiC, which has lower diffusion coefficients for dopants compared to silicon (Si). For example, in order to form SJ pillars 42 that, at least in some cases, extend through the entire thickness 44 of one or more epi layers 16, as present in a full SJ device, numerous (e.g., 10+) thin epitaxial growth/shallow ion implantation steps may be performed. Moreover, a combination of low energy implantation (e.g., implant acceleration energies less than 0.5 mega-electron volts (MeV)) and high energy implantation (e.g., implant acceleration energies greater than 0.5 MeV) may be used to implant the SJ pillars 42. For example, implant acceleration energies greater than 0.1 MeV and/or less than 50 MeV may be used. For instance, in some embodiments, an implant acceleration energy between 0.1 MeV and 30 MeV may be employed. Accordingly, the projected range (e.g., the penetration depth) of most commonly used SiC dopants (e.g., boron, nitrogen, phosphorus, aluminum) is approximately between 5 microns (μm) and 15 μm, which is suitable for implantation of the SJ pillars 42, as discussed below. Further, in some embodiments, a suitable high energy masking material (e.g., silicon on insulator (SOI), polysilicon, thick silicon oxide, high-Z metals such as platinum, molybdenum, gold) may be employed during the implantation of the SJ pillars 42.

Moreover, because the first set of SJ pillars 42A and the second set of SJ pillars 42B (e.g., the adjacent SJ pillars) are oppositely doped, misalignment between the first and second set of SJ pillars 42A and 42B, respectively, can undesirably adjust or modify the intended doping concentration of a portion of the SJ region 14. As a result, such a misaligned portion may contribute to non-uniform electric field distribution of the SJ semiconductor device 8, which may result in a lower breakdown voltage and/or blocking voltage of the SJ semiconductor device 8. Accordingly, it is recognized that the uniformity of the electric field of the SJ region 14 may be improved using the self-aligned masking techniques discussed herein. As a result, the SJ semiconductor device 8 may provide a higher breakdown voltage and/or blocking voltage.

Figure 2:
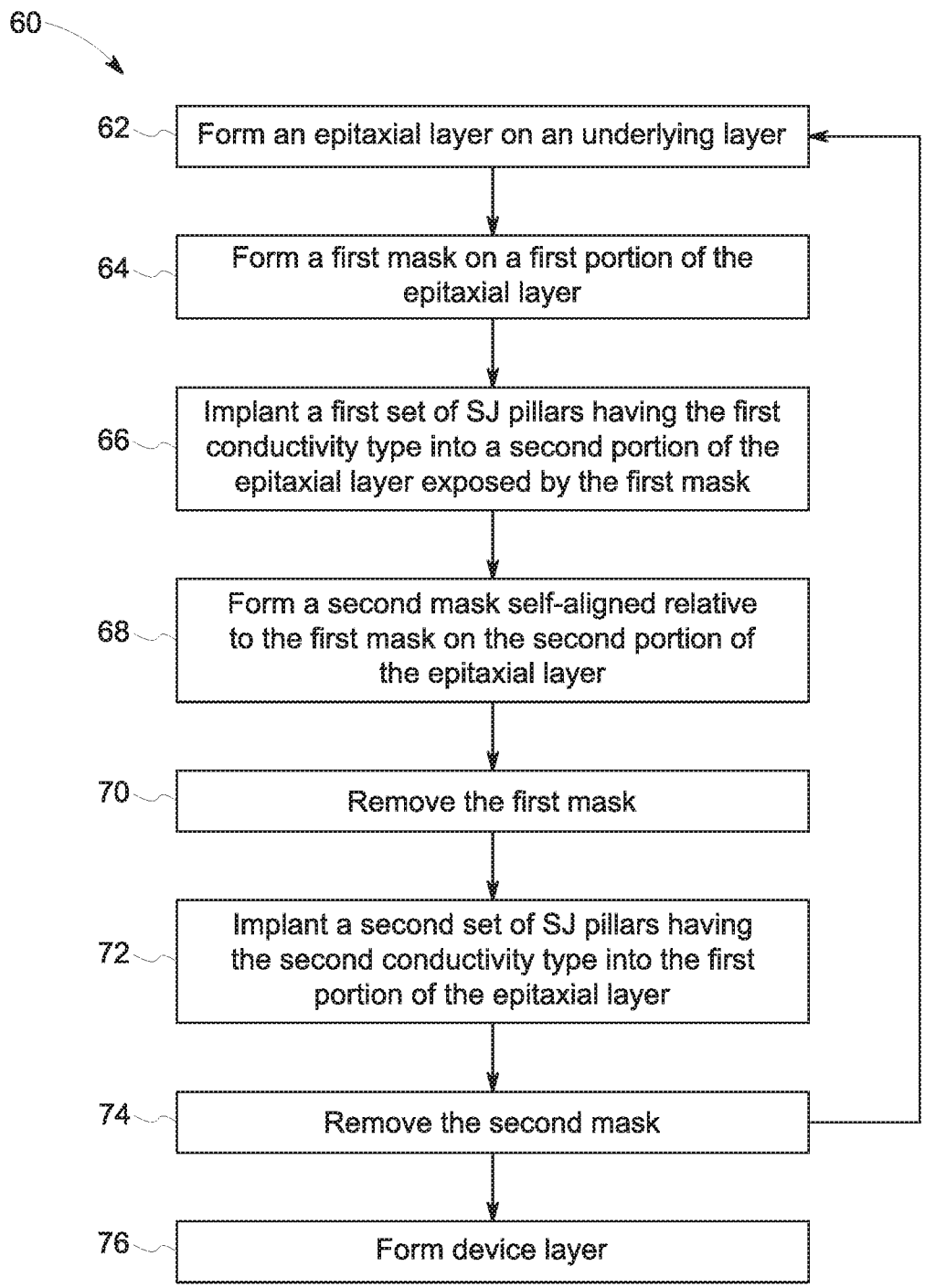
FIG. 2 is a flow chart of a process for manufacturing the SJ semiconductor device, in accordance with an embodiment.
Figure 3:
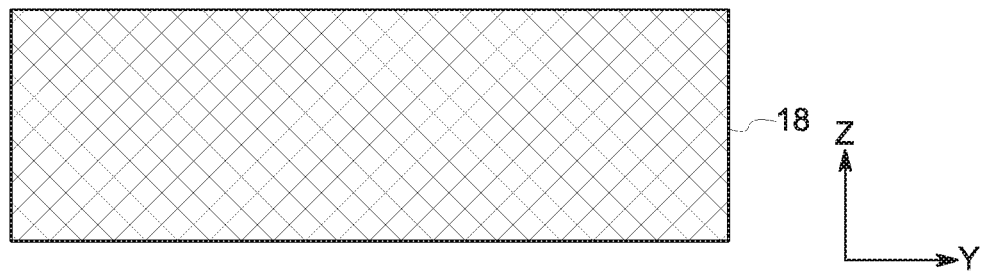
FIG. 3 is a cross-sectional view of a substrate layer, in accordance with an embodiment.

FIG. 2 is a flow chart of a process 60 for manufacturing an embodiment of the SJ semiconductor device 8, in accordance with embodiments described herein. Although the following description of the process 60 is described in a particular order, which represents a particular embodiment, it should be noted that the process 60 may be performed in any suitable order. Further, certain steps may be repeated or skipped altogether, and additional steps may be included in the process 60. The following description of the process 60 is described with reference to FIGS. 3-11.

The illustrated process 60 begins with an epi layer 16A being formed (block 62) on an underlying layer. In some embodiments, the underlying layer may include the semiconductor substrate layer 18. Accordingly, with reference to FIG. 3, the epi layer 16A may be formed on a substrate layer 18 made of silicon, silicon carbide (SiC), gallium nitride, diamond, aluminum nitride, and/or boron nitride. Alternatively, as described in greater detail below, the epi layer may be formed on another of the epi layers 16 (e.g., SJ layers 17).

Figure 4:
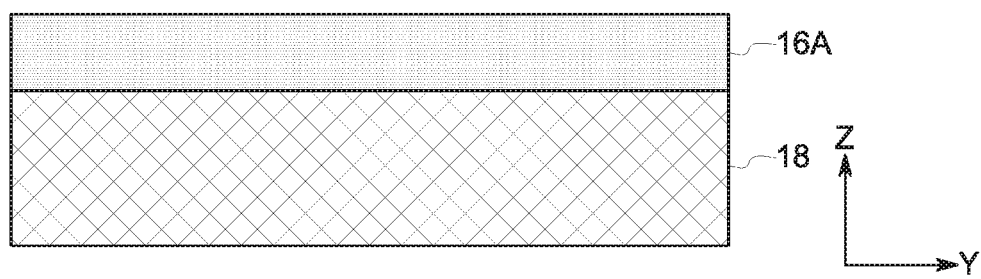
FIG. 4 is a cross-sectional view of an intermediate structure during fabrication of the SJ semiconductor device of FIG. 1, wherein the intermediate structure has a first epitaxial (epi) layer formed on the substrate layer of FIG. 3, in accordance with an embodiment.

To form the first epi layer 16A on the underlying layer, as illustrated by FIG. 4, the epi layer 16A may be grown using chemical vapor deposition (CVD). However, in some embodiments, the epi layer 16A may be grown onto the underlying layer using any suitable technique. The epi layer 16A may be formed from one or more wide-bandgap semiconductor materials, such as silicon carbide, gallium nitride, diamond, aluminum nitride, and/or boron nitride. Further, as discussed above, the epi layer 16A may have a first conductivity type (e.g., n-type) and a predetermined low dopant concentration. For example, in some embodiments, the dopant concentration of the epi layer 16A may be approximately less than $5\times10^{15}$ cm$^{-3}$ and/or approximately greater than or equal to $1\times10^{14}$ cm$^{-3}$.

Figure 5:
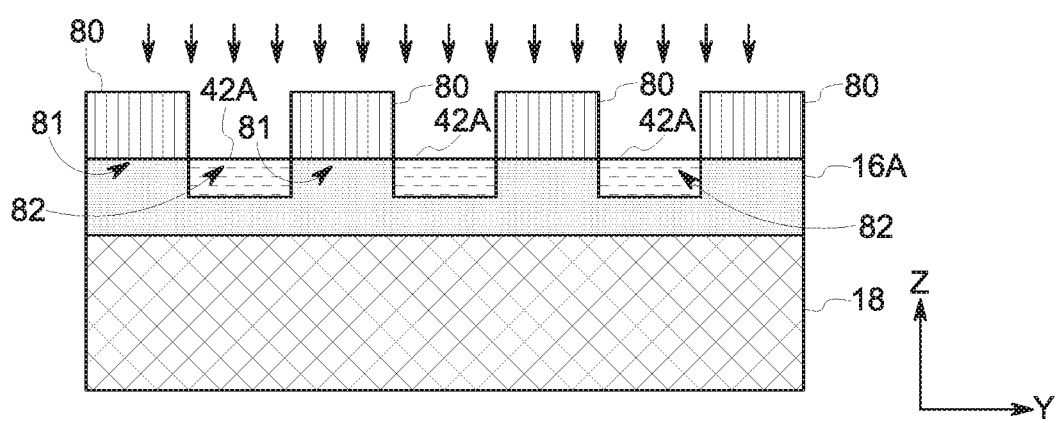
FIG. 5 is a cross-sectional view of the intermediate structure of FIG. 4 having a first mask formed on, and a first set of super-junction (SJ) pillars having a first conductivity type selectively implanted into, the epi layer, in accordance with an embodiment.

With reference now to FIGS. 2 and 5, after the epi layer 16A is formed on the underlying layer, the illustrated process 60 proceeds with a first mask 80 being formed (block 64) on a first portion 81 of the epi layer 16A. The first mask 80 may be formed from silicon oxide, silicon nitride, polycrystalline silicon, silicon, a metal layer, a resist layer, or a suitable combination thereof. Moreover, the first mask 80 may be formed using any suitable means. That is, for example, a first masking material may be deposited, grown, and/or coated and directly onto the first portion of the epi layer 16A. Furthermore, once the first mask material has been deposited on the surface of the epi layer 16A, the first mask 80 may be formed by patterning (e.g., lithographically patterning) the first mask material to expose or uncover a second portion 82 of the epi layer 16A, while the first portion 81 remains shielded or protected from subsequent implantation by the first mask 80.

Accordingly, the first set SJ pillars 42A having the first conductivity may be (block 66) selectively implanted into the second portion 82 of the epi layer 16A. Each of the first set of SJ pillars 42A may have a doping concentration less than or equal to $1\times10^{17}$ cm$^{-3}$ and/or greater than or equal to $5\times10^{15}$ cm$^{-3}$. Moreover, an implantation energy of greater than 0.1 MeV and/or less than 50 MeV may be used to implant each of the first set of SJ pillars 42A. That is, for example, the first set of SJ pillars 42A may be implanted according to a suitable combination of low and/or high energy implantation techniques. Accordingly, each of the first set of SJ pillars 42A may be implanted to a depth greater than approximately 5 μm and/or less than approximately 15 μm within the epi layer 16A. Thus, in some embodiments, the first set of SJ pillars 42A may extend through the epi layer 16A and may contact and/or connect to the underlying layer. In other embodiments, as illustrated, the first set of SJ pillars 42A may not extend through the entire thickness 44A of the epi layer 16A, leaving a gap (e.g., a region of epi doping) between the first set of SJ pillars 42A and the underlying layer. While the underlying layer illustrated in FIG. 5 is the substrate layer 18, in other embodiments, the first set of SJ pillars 42A may extend through an additional epi layer 16 (e.g., 16B) to contact other SJ layers 17 (e.g., SJ layer 17A). It should also be appreciated that, unlike nonsemiconductor masking materials, after implantation, the first masking material may be described as being doped with the first conductivity type (e.g., n-type).

Figure 6:
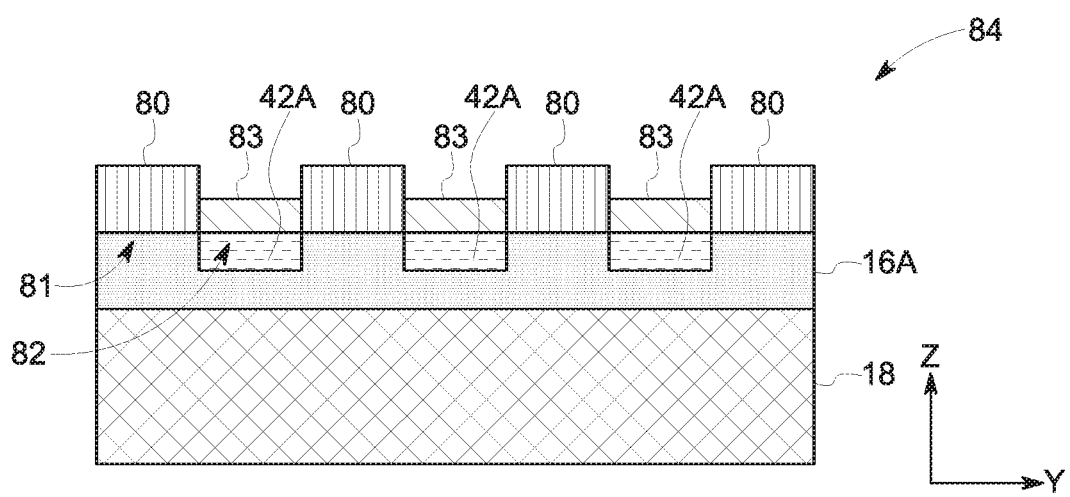
FIG. 6 is a cross-sectional view of the intermediate structure of FIG. 5 having a second mask formed on the epi layer and self-aligned relative to the first mask, in accordance with an embodiment.

Returning now to FIG. 2, after implanting the first set of SJ pillars 42A into the second portion 82 of the epi layer 16A, a second mask, self-aligned relative to the first mask 80, is formed (block 68) on the first epi layer 16A. That is, as illustrated in FIG. 6, because the first mask 80 masks the first portion 81 of the epi layer 16A, the second mask 83 is formed on the exposed first set of SJ pillars 42A, where the position of the second mask 83 is completely defined by the first mask 80. Forming the second mask 83 may yield a SJ layer intermediate 84 (e.g., a SJ semiconductor device intermediate).

Further, as discussed above with reference to the first mask 80, the second mask 83 is formed from a second masking material, such as silicon oxide, silicon nitride, polycrystalline silicon, silicon, a metal layer, a resist layer, or a suitable combination thereof. However, the second mask 83 is formed with a difference relative to the first mask 80, such that the second mask 83 has different physical and/or chemical properties relative to the first mask 80. In some embodiments, for example, the first mask 80 and second mask 83 may be formed from different materials. As such, in an embodiment having a first mask 80 formed from silicon oxide, the second mask 83 may be formed from silicon nitride, polycrystalline silicon, silicon, a metal layer, a resist layer, or a suitable combination thereof. Alternatively, the second mask 83 may be formed from the same material as the first mask 83. In such cases, however, the material used to form the second mask 83 may be chemically and/or physically altered to differentiate the second mask 83 relative to the first mask 81. For example, the second mask 83 may be formed with different optical properties and/or wavelength absorption relative to the first mask 81. Further, the second mask 83 material may be formed according to any suitable means. For example, the second mask 83 may be deposited, grown, and/or coated onto the surface of the epi layer 16A, including directly over the first set of SJ pillars 42A. In some embodiments, once the second mask 83 has been deposited, the second mask 83 may be polished and/or removed to expose any portion of the first mask 81 covered by the second mask 83. Additionally or alternatively, the second mask 83 may be formed with a different thickness from the first mask 81, which may maintain accessibility to the first mask 81, as illustrated.

Figure 7:
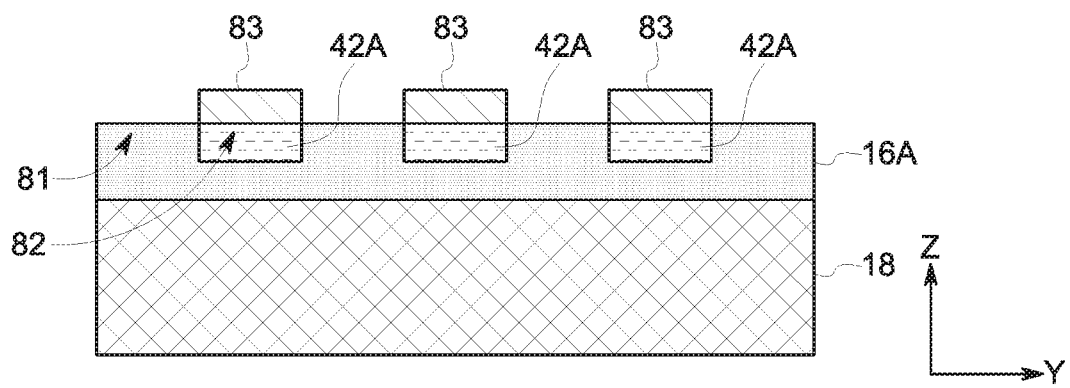
FIG. 7 is a cross-sectional view of the intermediate structure of FIG. 6 still including the second mask after the first mask has been removed, in accordance with an embodiment.

As illustrated by the process 60, the first mask 80 is then be removed (block 70) from the surface of the epi layer 16A without substantially removing the second mask 83. The first mask 80 may be removed according to any suitable technique. For example, the first mask 80 may be dissolved or degraded by a solvent, a chemical stripper may be applied such that the first mask 80 no longer adheres to the first portion 81 of the epi layer 16A, plasma stripping may be employed, or a combination thereof. Further, because the first mask 80 is formed from a different material than the second mask 83, the first mask 80 may be removed according to a technique, such that the second mask 83 remains effective (e.g., left intact and/or not removed). For instance, using the differences in chemical and/or physical properties between the first mask 80 and the second mask 83, the first mask 80 is removed using a process or procedure that does not substantially remove the second mask 83. As illustrated in FIG. 7, the first portion 81 of the epi layer 16 is exposed when the first mask 80 has been removed, while the first set of SJ pillars 42A remain masked by the second mask 83.

Figure 8:
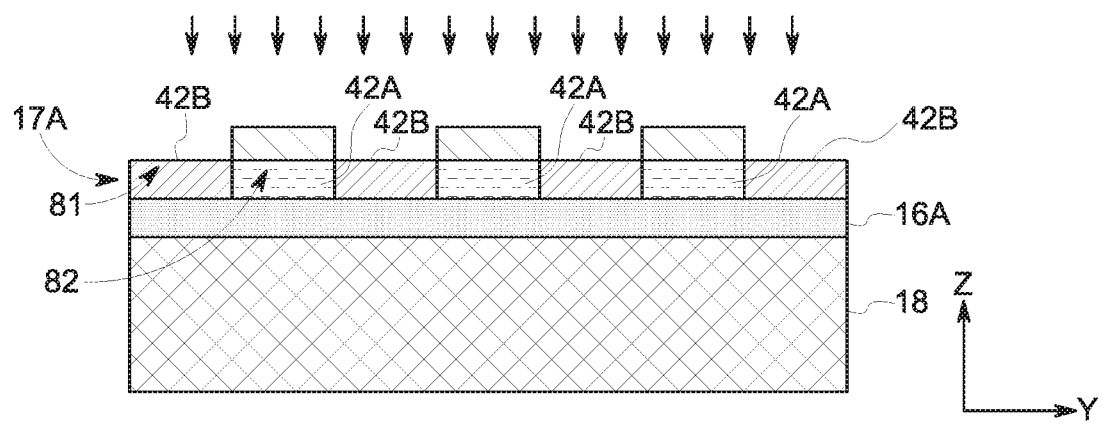
FIG. 8 is a cross-sectional view of the intermediate structure of FIG. 7 having a second set of SJ pillars with a second conductivity type selectively implanted into the epi layer, in accordance with an embodiment.

After removing the first mask 80, the illustrated process 60 proceeds with the second set of SJ pillars 42B having the second conductivity type being implanted (block 72) into the first portion 81 of the epi layer 16. Thus, as illustrated in FIG. 8, after the second implantation, the epi layer 16A include the first set of implanted SJ pillars 42A interleaved between the second set of implanted SJ pillars 42B. More specifically, because the second mask 83 was formed relative to the first mask 80 using the disclosed self-aligning technique, the second set of SJ pillars 42B is implanted adjacent to and aligned with the first set of SJ pillars 42A. It should also be appreciated that, unlike non-semiconductor masking materials, after implantation, the second masking material may be described as being doped with the second conductivity type (e.g., p-type).

As discussed above with reference to the first set of SJ pillars 42A, each of the second set of SJ pillars 42B may have a doping concentration within a range less than $1 \times 10^{17}$ cm$^{-3}$ and/or greater than or equal to $5 \times 10^{15}$ cm$^{-3}$. Moreover, each of the second set of SJ pillars 42B may have a doping concentration approximately equal to each of the first set of SJ pillars 42A. Further, an implantation energy of greater than 0.1 MeV and/or less than 50 MeV may be used to implant each of the second set of SJ pillars 42B. That is, for example, the second set of SJ pillars 42B may be implanted via a suitable combination of low and/or high implantation energy techniques. Accordingly, each of the second set of SJ pillars 42B may be implanted to a depth greater than approximately 5 μm and/or less than approximately 15 μm within the epi layer 16. Moreover, as illustrated, the depth at which the second set of SJ pillars 42B is implanted may be approximately equal to the depth at which the first set of SJ pillars 42A is implanted. Accordingly, in such embodiments, the thickness of the SJ layer 17 may be approximately uniform.

It may be noted that, if the second set of SJ pillars 42B was implanted into the first portion 81 of the epi layer 16 without a self-aligned second mask 83 and/or the second mask 83 were formed onto the first SJ pillar 42 after the first mask 80 were removed, the second set of SJ pillars 42B may be implanted with a certain amount of misalignment relative to the first set of SJ pillars 42A. That is, for example, the second set of SJ pillars 42B may be implanted into the first portion 81 of the epi layer 16A and may overlap with or remain separated from the first set of SJ pillars 42A due to misalignment, which may be on the order of approximately 0.2 μm to approximately 0.5 μm. Further, because the first set of SJ pillars 42A and the second set of SJ pillars 42B are oppositely doped, overlap of the first set of SJ pillars 42A and the second set of SJ pillars 42B may undesirably modify (e.g., negate, cancel out) a portion of the implanted dopant within these features. As a result, such a misaligned portion may contribute to imbalances between the two conductivity types of dopants in the SJ region 14, which may result in a lower breakdown voltage and/or blocking voltage of the SJ semiconductor device 8. Accordingly, change balance and, thereby, the uniformity of the electric field of the SJ region 14 may be improved by using the self-aligned second mask 83 to implant the second set of SJ pillars 42B. As a result, the SJ semiconductor device 8 may provide higher voltage blocking and/or a higher breakdown voltage than SJ devices fabricated using a non-self-aligned process.

Referring back to FIG. 2, the process 60 then proceeds with the second mask 83 being be removed (block 74). As discussed above, the first mask 80 and the second mask 83 are formed from materials having different chemical and/or physical properties. Accordingly, the second mask 83 is removed using a different technique than the technique used to remove the first mask 80. For example, a different solvent may be used to dissolve the second mask 83, a different chemical stripper may be used so that the second mask 83 no longer adheres to the second portion 82 of the epi layer 16A.

Figure 9:
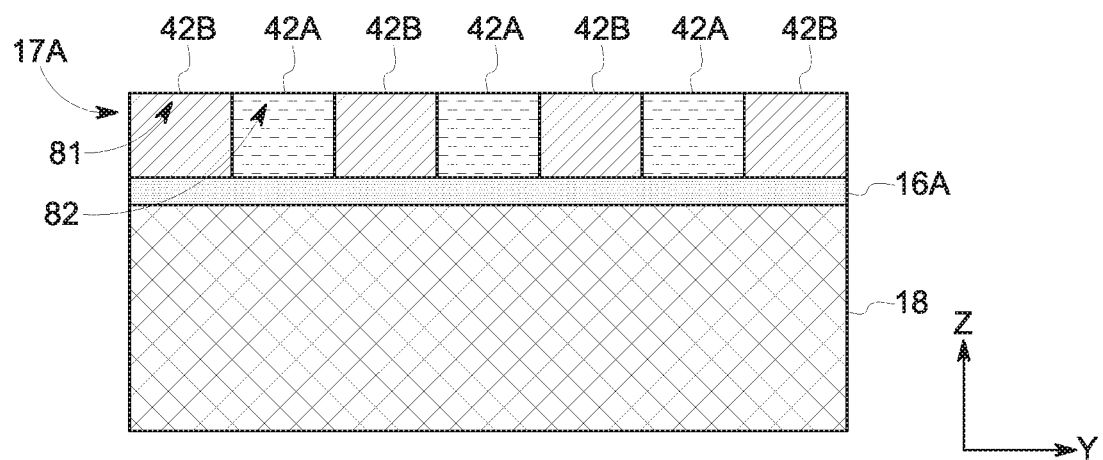
FIG. 9 is a cross-sectional view of the intermediate structure of FIG. 8 in which the second mask has been removed to expose a first super-junction (SJ) layer, in accordance with an embodiment.
Figure 10:
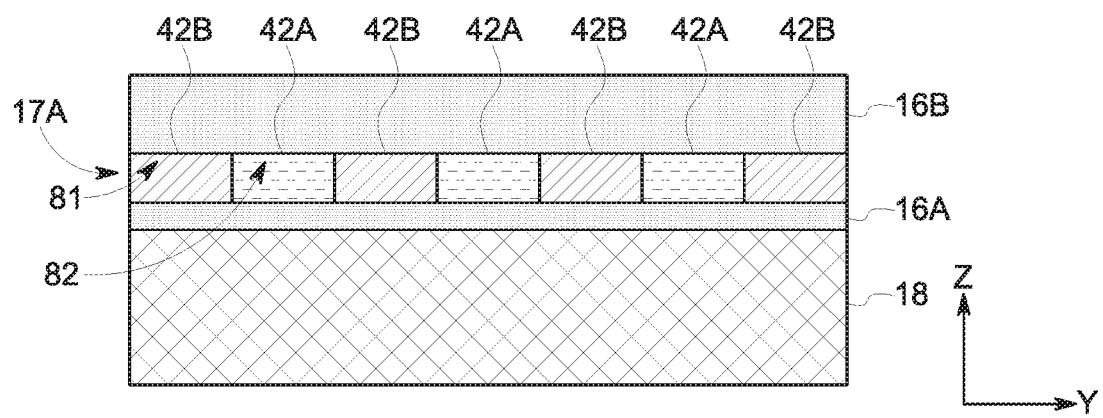
FIG. 10 is a cross-sectional view of the intermediate structure of FIG. 9 having an epi layer formed on the first SJ layer, in accordance with an embodiment.

Removing the second mask 83, yields a first SJ layer 17A of a SJ region 14 on the underlying layer (e.g., the substrate layer 18), as illustrated in FIG. 9. A portion of the process 60 (e.g., blocks 62, 64, 66, 68, 70, 72, and 74) may then be repeated a suitable number of instances, which may increase the thickness of the SJ region 14. That is, it should be noted that the epitaxial growth/ion implantation steps may be repeated multiple (e.g., 2, 3, 4, 5, or more) times to yield a SJ region 14 with any suitable number of SJ layers 17. More specifically, an additional epi layer 16B may be formed (block 62) on an underlying layer (e.g., epi layer 16A). That is, as illustrated in FIG. 10, the additional epi layer 16B may be formed directly on the epi layer 16A, which was formed by a previous iteration of the process 60.

Figure 11:
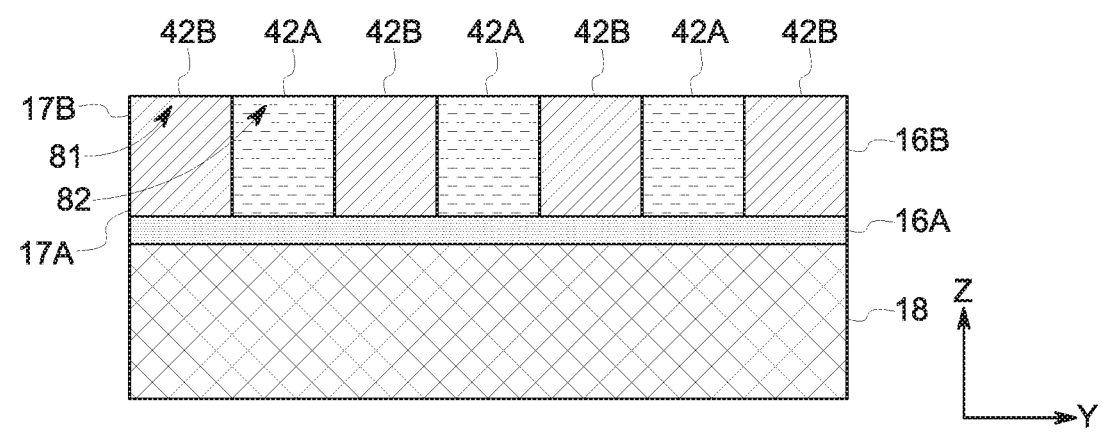
FIG. 11 is a cross-sectional view of the intermediate structure of FIG. 10 having a second SJ layer formed on and aligned with the first SJ layer, in accordance with an embodiment.

It should be noted that in repeating the portion of the process 60, the first and second set of SJ pillars 42 may be implanted into any suitable number of subsequent epi layers 16 (e.g., 16B, 16C, 16D, and so forth) in alignment with the respectively corresponding set of SJ pillars 42 in the underlying layer. That is, for example, the first set of SJ pillars 42A may be implanted in alignment with the corresponding first set of SJ pillars 42A in the underlying layer (e.g., the first epi layer 16A), and the second set of SJ pillars 42B may be implanted in alignment with the corresponding second set of SJ pillars 42B in the underlying layer (e.g., the first epi layer 16A). Moreover, at least in the case that the underlying layer is one of the SJ layers 17 (e.g., SJ layer 17A), the first and second set of SJ pillars 42 may be implanted with sufficient implantation energy to connect with the respectively corresponding set of SJ pillars 42 in the underlying layer. Accordingly, as illustrated in FIG. 11, a second SJ layer 17B may be formed directly on and in alignment with the first SJ layer 17A.

As illustrated in FIG. 2, after performing the portion of the process 60 one or more times, a device layer 12 may be formed (block 76) above the one or more SJ layers 17 of the device. As discussed above, the device layer 12 may include a well region 22, a source region 24, or any other suitable features of the SJ semiconductor device 8, or features of another FET device (e.g., a JFET, BJT, or diode device). Subsequently, other processing steps may be performed to form other features (e.g., dielectric layer 26, gate electrode 27, source contact 30, drain contact 28) of the SJ semiconductor device 8 to form a functional device, in accordance with the present disclosure. For instance, in some embodiments, the well regions 22, which may have the second conductivity type (e.g., p-type well regions 22), may be electrically coupled to the second set of SJ pillars 42B, as illustrated in FIG. 1.

Technical effects of the invention include designs and methods of manufacturing SJ devices that increase the blocking voltage of SJ devices. In particular, the disclosed SJ devices include a SJ region that reshapes the electrical field in the active area of a SJ device to enable low conduction losses and high blocking voltages while still maintaining a relatively simple fabrication process. More specifically, using a set of masks and a method of self-alignment, misalignment between oppositely-doped SJ pillars implanted to form the SJ region may be reduced. Accordingly, the resulting SJ region may have approximately uniform alignment and balanced doping between the first and second sets of SJ pillars. Further, by fabricating approximately uniform regions of balanced charge in the active area of the SJ device, the maximum breakdown voltage and/or blocking voltage of the SJ devices may be increased.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of manufacturing a super-junction (SJ) layer of a SJ device, comprising:
    forming a first epitaxial (epi) layer having a first conductivity type on an underlying layer, wherein the underlying layer is formed from a wide-bandgap material;
    forming a first mask by disposing a first material on a first portion and a second portion of the first epi layer and then patterning the first material to selectively expose the second portion of the first epi layer;
    selectively implanting a first set of SJ pillars having the first conductivity type into the exposed second portion of the first epi layer;
    forming a second mask by disposing a second material different from the first material on the second portion of the first epi layer, wherein the second mask is self-aligned relative to the first mask;
    removing the first mask to expose the first portion of the first epi layer without exposing the second portion of the first epi layer;
    selectively implanting a second set of SJ pillars having a second conductivity type into the exposed first portion of the first epi layer; and
    removing the second mask to yield the SJ layer.

2. The method of claim 1, comprising:
    forming a second epi layer having the first conductivity type on the SJ layer, wherein the second epi layer is formed from the wide-bandgap material;
    forming the first mask by disposing the first material on a first portion and a second portion of the second epi layer and then patterning the first material to selectively expose the second portion of the second epi layer;
    selectively implanting the first set of SJ pillars into the second portion of the second epi layer;
    forming the second mask by disposing the second material on the second portion of the second epi layer, wherein the second mask is self-aligned relative to the first mask on the second epi layer;
    removing the first mask to expose the first portion of the second epi layer without exposing the second portion of the second epi layer;
    selectively implanting the second set of SJ pillars having the second conductivity type into the exposed first portion of the second epi layer; and
    removing the second mask to yield an additional SJ layer.

3. The method of claim 2, wherein implanting the first set of SJ pillars into the second portion of the second epi layer comprises implanting the first set of SJ pillars to extend through an entire thickness of the second epi layer and contact the first set of SJ pillars of the first epi layer.

4. The method of claim 1, wherein implanting the first set of SJ pillars comprises implanting using implantation energies equal to or greater than approximately 0.1 mega-electron volts (MeV).

5. The method of claim 4, wherein the implantation energies are less than approximately 50 MeV.

6. The method of claim 1, wherein implanting the first set of SJ pillars comprises implanting to a depth equal to or greater than approximately 5 microns (µm).

7. The method of claim 6, wherein the depth is equal to or less than approximately 15 µm.

8. The method of claim 1, wherein implanting the first set of SJ pillars comprises implanting the first set of SJ pillars to extend through a thickness of the first epi layer and contact the underlying layer.

9. The method of claim 1, wherein the first epi layer comprises silicon carbide (SiC).

10. The method of claim 1, comprising forming the first epi layer with a doping concentration approximately less than $5 \times 10^{15}$ per centimeter cubed ($cm^{-3}$).

11. The method of claim 10, wherein the doping concentration is approximately greater than or equal to $1 \times 10^{14}$ $cm^{-3}$.

12. The method of claim 1, wherein the first set of SJ pillars comprises a doping concentration between approximately $5 \times 10^{15}$ $cm^{-3}$ and approximately $1 \times 10^{17}$ $cm^{-3}$.

13. The method of claim 1, wherein the underlying layer comprises a semiconductor substrate layer, a second epi layer, an additional SJ layer, or a combination thereof.

14. The method of claim 1, comprising forming a device layer having the first conductivity type above the SJ layer to yield a super-junction (SJ) semiconductor device, wherein the SJ semiconductor device comprises a metal-oxide-semiconductor field-effect transistor (MOSFET), a junction field effect transistor (JFET), a bipolar junction transistor (BJTs), or a diode.

15. A super-junction (SJ) semiconductor device intermediate, comprising:
    an epitaxial (epi) layer having a first conductivity type, wherein the epi layer comprises a wide-bandgap material, wherein a first portion of the epi layer comprises a plurality of implanted super-junction (SJ) pillars having a second conductivity type;
    a first high energy implantation mask disposed directly above the first portion of the epi layer, wherein the first high energy implantation mask comprises a first material; and
    a second high energy implantation mask disposed self-aligned relative to the first high energy implantation mask directly above a second portion of the epi layer, wherein the second high energy implantation mask comprises a second material different from the first material, wherein the second portion of the epi layer is not covered by the first high energy implantation mask.

16. The SJ semiconductor device intermediate of claim 15, wherein when a removal technique is applied to the SJ semiconductor device intermediate, the first high energy implantation mask is configured to be removed based at least in part on the first material and the second high energy implantation mask is configured to remain effective based at least in part on a chemical difference, a physical difference, or a combination thereof between the first high energy implantation mask and the second high energy implantation mask.

17. The SJ semiconductor device intermediate of claim 15, wherein the first high energy implantation mask and the second high energy implantation mask independently comprise a different one or more of silicon oxide, silicon nitride, polycrystalline silicon, silicon, a metal layer, or a resist layer.

18. A method, comprising:
A) forming an epitaxial (epi) layer having a first conductivity type on an underlying layer, wherein the underlying layer is formed from a wide-bandgap material;
B) forming a first mask comprising a first material disposed on a first portion of the epi layer, wherein a second portion of the epi layer is exposed by the first mask;
C) selectively implanting a first set of super-junction (SJ) pillars having a second conductivity type into the second portion of the epi layer;
D) forming a second mask comprising a second material disposed on the second portion of the epi layer, wherein the second mask is self-aligned relative to the first mask and the second material is different from the first material;
E) removing the first mask to expose the first portion of the epi layer without exposing the second portion of the epi layer;
F) selectively implanting a second set of SJ pillars having the first conductivity type into the exposed first portion of the epi layer;
G) removing the second mask to yield a super-junction (SJ) layer; and
H) forming a device layer having the first conductivity type above the SJ layer to yield a super-junction (SJ) semiconductor device.

19. The method of claim 18, comprising, prior to step H, repeating steps A-G at least once to form an additional SJ layer.

20. The method of claim 18, wherein forming the epi layer comprises growing the epi layer directly on the underlying layer.

21. The method of claim 18, wherein selectively implanting the second set of SJ pillars comprises implanting the second set of SJ pillars adjacent to, and interleaved between, the first set of SJ pillars.

22. The method of claim 18, wherein selectively implanting the first set of SJ pillars comprises implanting with boron, aluminum, or a combination thereof, and, wherein selectively implanting the second set of SJ pillars comprises implanting with nitrogen, phosphorous, or an additional combination thereof.

23. The method of claim 18, wherein the underlying layer comprises a semiconductor substrate layer, wherein the semiconductor substrate layer comprises silicon carbide (SiC).

24. The method of claim 18, wherein the super-junction (SJ) semiconductor device is a metal-oxide-semiconductor field-effect transistor (MOSFET), a junction field effect transistors (JFET), a bipolar junction transistors (BJT), or a diode.

* * * * *